United States Patent
Sinoussi et al.

(10) Patent No.: US 11,252,550 B1
(45) Date of Patent: Feb. 15, 2022

(54) FREQUENCY-DIVISION-COORDINATED AUTOMATIC POWER CONTROL FOR NEAR-FIELD COMMUNICATION

(71) Applicant: SHENZHEN GOODIX TECHNOLOGY CO., LTD., Shenzhen (CN)

(72) Inventors: Nabil Sinoussi, Cairo (EG); Michael Sherif Sobhy Nagib, Cairo (EG); Ahmed Sayed Abbas Metawea, Cairo (EG)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 17/110,295

(22) Filed: Dec. 3, 2020

(51) Int. Cl.
| | |
|---|---|
| *H04W 4/80* | (2018.01) |
| *H04L 5/00* | (2006.01) |
| *H03F 3/24* | (2006.01) |
| *H04L 27/12* | (2006.01) |
| *H04L 27/26* | (2006.01) |

(52) U.S. Cl.
CPC .............. *H04W 4/80* (2018.02); *H03F 3/245* (2013.01); *H04L 5/0048* (2013.01); *H04L 27/12* (2013.01); *H04L 27/2601* (2013.01)

(58) Field of Classification Search
CPC ......... H04W 4/80; H04W 4/021; H04W 4/40; H04W 4/029; H04W 76/10; H04W 4/023; H04W 72/0453; H04W 84/18; H04W 8/005; H04W 8/205; H04W 12/06; H04W 12/08; H04W 12/35; H04W 12/43; H04W 12/50; H04W 12/77; H04W 28/0268; H04W 28/24; H04W 36/0055; H04W 36/00837

USPC ......................................................... 455/41.1
See application file for complete search history.

(56) References Cited

U.S. PATENT DOCUMENTS

| | | |
|---|---|---|
| 10,390,200 B2 | 8/2019 | Hueber et al. |
| 2014/0184150 A1 | 7/2014 | Walley et al. |
| 2015/0341073 A1 | 11/2015 | Ayala Vazquez et al. |

(Continued)

FOREIGN PATENT DOCUMENTS

CN          109428631 A          3/2019

*Primary Examiner* — Ajibola A Akinyemi
(74) *Attorney, Agent, or Firm* — Kilpatrick Townsend & Stockton LLP

(57) ABSTRACT

Techniques are described for frequency-division-coordination of automatic power control (APC) in a transceiver of a near-field reader. Such frequency-division-coordinated APC (FDC-APC) can enable continuous APC updates concurrent with communication frames to achieve field strength specifications without conventional degradations in communication reliability. For example, a transceiver implements a FDC-APC loop that received a detuning signal from signals received and/or transmitted over a near-field communication link, generates an error signal by comparing the detuning signal with a reference detuning level, and updates a power control signal according to an update frequency (e.g., corresponding to a APC loop bandwidth) that is a function of at least a filter frequency profile and is out-of-band with respect to a modulation frequency band. Modulated signals can be transmitted over the near-field communication link according to variable power settings controlled to the power control signal.

21 Claims, 11 Drawing Sheets

(56) References Cited

U.S. PATENT DOCUMENTS

| | | | |
|---|---|---|---|
| 2017/0256979 A1* | 9/2017 | Von Novak | H02J 50/12 |
| 2018/0038903 A1 | 2/2018 | Pascolini et al. | |
| 2018/0176712 A1* | 6/2018 | Hueber | H04B 5/0075 |
| 2019/0097687 A1 | 3/2019 | Hueber et al. | |
| 2019/0098435 A1* | 3/2019 | Zeng | H01Q 1/52 |

* cited by examiner

FREQUENCY-DIVISION-COORDINATED AUTOMATIC POWER CONTROL FOR NEAR-FIELD COMMUNICATION

FIELD OF THE INVENTION

The present invention relates generally to near-field communications. More particularly, embodiments relate to continuous field control for uninterrupted near-field communications, such as for uninterrupted dynamic control of near-field wireless communications between a reader and a passive or emulated-passive device.

BACKGROUND OF THE INVENTION

Various types of short-range radiofrequency (RF) communications, including Near-Field Communications (NFC), are becoming ubiquitous for a wide range of applications, such as for contactless access cards, contactless payment cards, contactless interfaces between devices and peripherals, etc. Typical NFC systems use inductive coupling to effect contactless exchange of data over a short range (e.g., around 1.5 inches) between at least two elements: a reader or other "poller" (generally referred to herein as a reader); and a tag, card, or other "listener" (generally referred to herein as a tag). Many NFC applications support passive devices, in which the devices include one or more integrated chips and an integrated antenna, but no battery. Other NFC applications support a so-called "card emulation," or "CE" mode, in which an active device (e.g., a smart phone) can emulate a passive card or tag. During operation, the reader can send a command transmission by modulating an RF carrier, which induces a current in the antenna of the device. The induced signal can be harvested by the device for power, clocking, receiving commands, etc.; and the device can automatically respond by modulating the RF carrier according to device data. The reader can detect and process the response to recover the device data.

Such NFC communications involve forming a near-field wireless communication link through mutual inductance and/or the magnetic coupling between the reader and device antennas. The coupling effectively inserts the tag as an additional load on the reader antenna circuit, and the magnitude of this additional load changes with the distance between the tag and the reader. Typically, the reader is tuned to operate at around a resonant operating frequency (e.g., 13.65 MHz for some NFC communications) when not loaded by any proximate NFC devices. However, as the NFC device approaches the reader, the change in loading of the reader antenna can detune its resonance frequency away from the tuned operating frequency. To compensate for such detuning, some readers can detect detuning and adjust transmission power, accordingly. However, conventional approaches to such compensation can tend to reduce communication quality and/or to potentially damage the circuits of devices being read.

BRIEF SUMMARY OF THE INVENTION

Embodiments provide circuits, devices, and methods for frequency-division-coordination of automatic power control (APC) in a transceiver of a near-field reader. Such frequency-division-coordinated APC (FDC-APC) can enable continuous APC updates concurrent with communication frames to achieve field strength specifications without conventional degradations in communication reliability. For example, a transceiver implements a FDC-APC loop that received a detuning signal from signals received and/or transmitted over a near-field communication link, generates an error signal by comparing the detuning signal with a reference detuning level, and updates a power control signal according to an update frequency (e.g., corresponding to a APC loop bandwidth) that is a function of at least a filter frequency profile and is out-of-band with respect to a modulation frequency band. Modulated signals can be transmitted over the near-field communication link according to variable power settings controlled to the power control signal.

According to one set of embodiments, a transceiver system is provided for near-field communications. The transceiver system includes: a receiver to receive response signals via a near-field communication link; a transmitter to transmit command signals via the near-field communication link in accordance with a power control signal, the command signals generated by modulating a carrier within a modulation frequency band; and a frequency-division coordinator coupled with the transmitter. The frequency-division coordinator is to: receive a detuning signal from the receiver and/or from the variable power transmitter; generate an error signal by comparing the detuning signal with a reference detuning level; and generate the power control signal by filtering the error signal according to a filter frequency profile, such that the power control signal is updated dynamically according to an update frequency that is a function of at least the filter frequency profile and is out-of-band with respect to the modulation frequency band.

According to some such embodiments, a near-field reader system includes a reader antenna and a reader passive network that are coupled with the transceiver system. In such embodiments, the reader antenna and the reader passive network are configured to: establish the near-field link by inductive coupling with a tag when a proximity of the tag to the near-field reader system is within a threshold distance, the establishing causing variable loading of the near-field reader system by the tag based at least on the proximity; receive the response signals via the near-field communication link and pass the response signals to the receiver; and receive the command signals from the transmitter and transmit the command signals via the near-field communication link.

According to another set of embodiments, a method is provided for frequency-division coordinated automatic power control of a near-field transceiver. The method includes: updating a power control signal, according to an update frequency that is a function of at least a filter frequency profile and is out-of-band with respect to a modulation frequency band, by iteratively: generating a detuning signal during communicating of signals by the near-field transceiver via a near-field communication link, such that the detuning signal corresponds to a present field strength of the near-field communication link that changes in response to dynamic loading on the near-field transceiver by a tag inductively coupled via the near-field communication link; generating an error signal by comparing the detuning signal with a reference detuning level; and generating the power control signal by filtering the error signal according to the filter frequency profile. The communicating of the signals by the near-field transceiver via the near-field communication link is in accordance with modulation of a carrier signal in the modulation frequency band. The communicating of the signals includes transmitting command signals by the near-field transceiver via the near-field communication link in accordance with the power control signal.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Various types of short-range radiofrequency (RF) communications are becoming ubiquitous for a wide range of applications. For example, passive, contactless data devices are being used to authorize access to secure facilities, to effect electronic payment transactions at points of sale, to withdraw cash at automated teller machines, to quickly register and/or connect peripherals (e.g., headphones, printers, drives, etc.) to electronic devices, etc. Near-Field Communications (NFC) is one such RF communications technology that uses inductive coupling between devices to effect contactless exchange of data between devices over a short range (e.g., around 1.5 inches). Typical NFC systems include at least two elements: a reader or other "poller" (generally referred to herein as a "reader"); and a tag, card, or other "listener" (generally referred to herein as a "tag"). Though terms, like "reader" and "tag" are used herein, it will be appreciated that certain novel embodiments described herein can be applied generally to any devices that use automatic power control for communications over a mutually inductive link, or the like.

Figure 1:
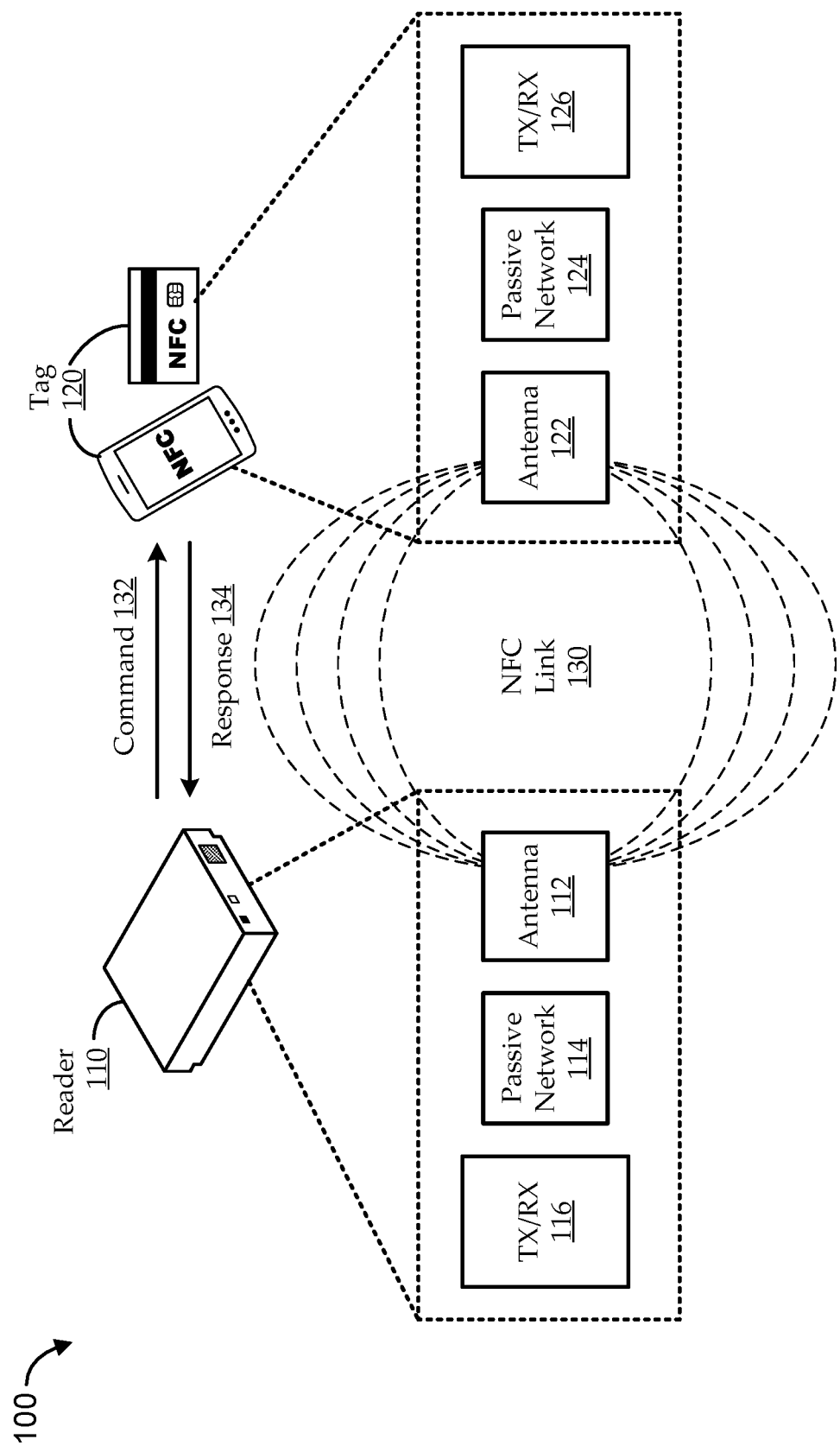
FIG. 1 shows an illustrative Near-Field Communications (NFC) transaction environment, as context for various embodiments described herein.

FIG. 1 shows an illustrative Near-Field Communications (NFC) transaction environment 100, as context for various embodiments described herein. As illustrated, the NFC transaction environment includes a reader 110 and a tag 120. In some embodiments, the tag 120 is a passive device, such as a passive contactless smart card, a passive tag, etc. In such embodiments, the passive tag 120 typically includes one or more integrated chips and an integrated antenna, but no battery. In other embodiments, the tag 120 is implemented by an active device, such as a smart phone, wearable device (e.g., smart watch or fitness tracker), etc. In some such embodiments, the active device is configured to support a so-called "card emulation," or "CE" mode, in which the active device emulates a passive card or tag. For example, in CE mode, the active device can act as an emulated-passive tag to engage in near-field wireless communications with a reader even when in low-power standby mode, or otherwise with minimal power consumption. The reader 110 can be implemented in any suitable device, such as in an electronic lock, access control system, point of sale terminal, automated teller machine, etc.

A typical NFC transaction can involve the tag 120 being read by the reader 110 over an NFC link 130. The reader 110 uses a reader transceiver block ("Tx/Rx") 116, a reader passive network 114, and a reader antenna 112 to broadcast a "command" signal 132 over a modulated RF carrier. For example, the reader 110 modulates the RF carrier (e.g., at 13.56 Megahertz) using amplitude shift keying (ASK), on-off keying (OOK), or other suitable techniques. The tag 120 receives the command signal 132 via the NFC link 130 using a tag antenna 122, a tag passive network 124, and a tag transceiver block 126. The command signal 132 induces a current in the tag antenna 122. The induced energy from the command signal 132 can be harvested and regulated by the tag 120 to generate power for circuitry, to derive clocking information, to parse commands from the reader 110, etc. The activated circuitry of the tag 120 can automatically respond by sending a response signal 134 from the tag 120 back to the reader 110 over the NFC link 130. For example, the tag 120 can generate the response signal 134 by modulating a load (e.g., by active load modulation or passive load modulation) according to data stored on the tag, or in storage accessible to the tag. The reader can detect and process the response signal 134 to recover the transmitted data.

When the reader 110 interrogates the tag 120 to interchange data through the NFC link 130, the reader antenna 112 and the tag antenna 122 are both primarily inductive. When the tag 120 approaches to within a certain proximity of the reader 110 (or the reader 110 to the tag 120), the NFC link 130 is formed through mutual inductance and/or magnetic coupling between the reader antenna 112 and the tag antenna 122. The NFC link 130 effectively extends the circuit of the reader antenna 112 to include the tag 120. As such, the tag 120 effectively becomes an additional load on the transmitter of the reader 110 via the mutual coupling. The magnitude of this additional load changes with the distance between the tag 120 and the reader 110. For example, as the tag 120 approaches the reader 110, the effective loading on the reader antenna 112 increases.

When the reader 110 is not loaded by any tag 120 (e.g., when no tag 120 is in proximity to the reader 110), the reader 110 can be calibrated to a "tuned" configuration. In such a configuration, components of the reader transceiver block 116, the reader passive network 114, and the reader antenna 112 can be tuned to resonate around an operating carrier frequency (e.g., 13.65 MHz for some NFC communications). As the tag 120 approaches the reader 110, the loading of the tag 120 changes the reader antenna 112 impedance, which causes the resonance frequency of the reader 110 circuitry to detune away from the tuned operating frequency. As used herein, such "detuning" can generally refer to the overall process and effect of the tag 120 approaching the reader 110, the resulting increase in reader antenna 112 loading, the resulting deviation in resonant frequency of the reader antenna 112 and related components, etc.

Such detuning can frustrate effective communication over the NFC link 130. For example, an output field strength is one of the important requirements that the reader 110 has to achieve in order to comply with different NFC standards. The field strength generated by the reader 110 has to fit within an upper field strength limit and a lower field strength limit, inside a certain operating volume around the reader 110. The upper field strength limit, the lower field strength limit and the operating volume are specified by every NFC standard independently. Although the field is originally generated by the reader 110, the field strength across the operating volume (i.e., the effective volume over which communications are occurring between the reader 110 and the tag 120) is not solely dependent on the reader 110; it is also dependent on the tag 110 structure and position inside the operating volume. This is due at least to the proximity-dependent loading of the reader 110 by the tag 120 when the tag 120 approaches the reader 110 within the operating volume, as described above. In particular, movement of the tag 120 relative to the reader 110 affects detuning, which manifests as a change in the field strength profile across the operating volume. Thus, to meet field strength specifications (e.g., according to NFC standards), conventional readers 110 can be configured to sense the proximity-based detuning, and the transmit power of the transmitter of the reader 110 is dynamically updated, accordingly. This sense-update loop is often referred to as Automatic Power Control (APC), or Dynamic Power Control (DPC).

Figure 2:
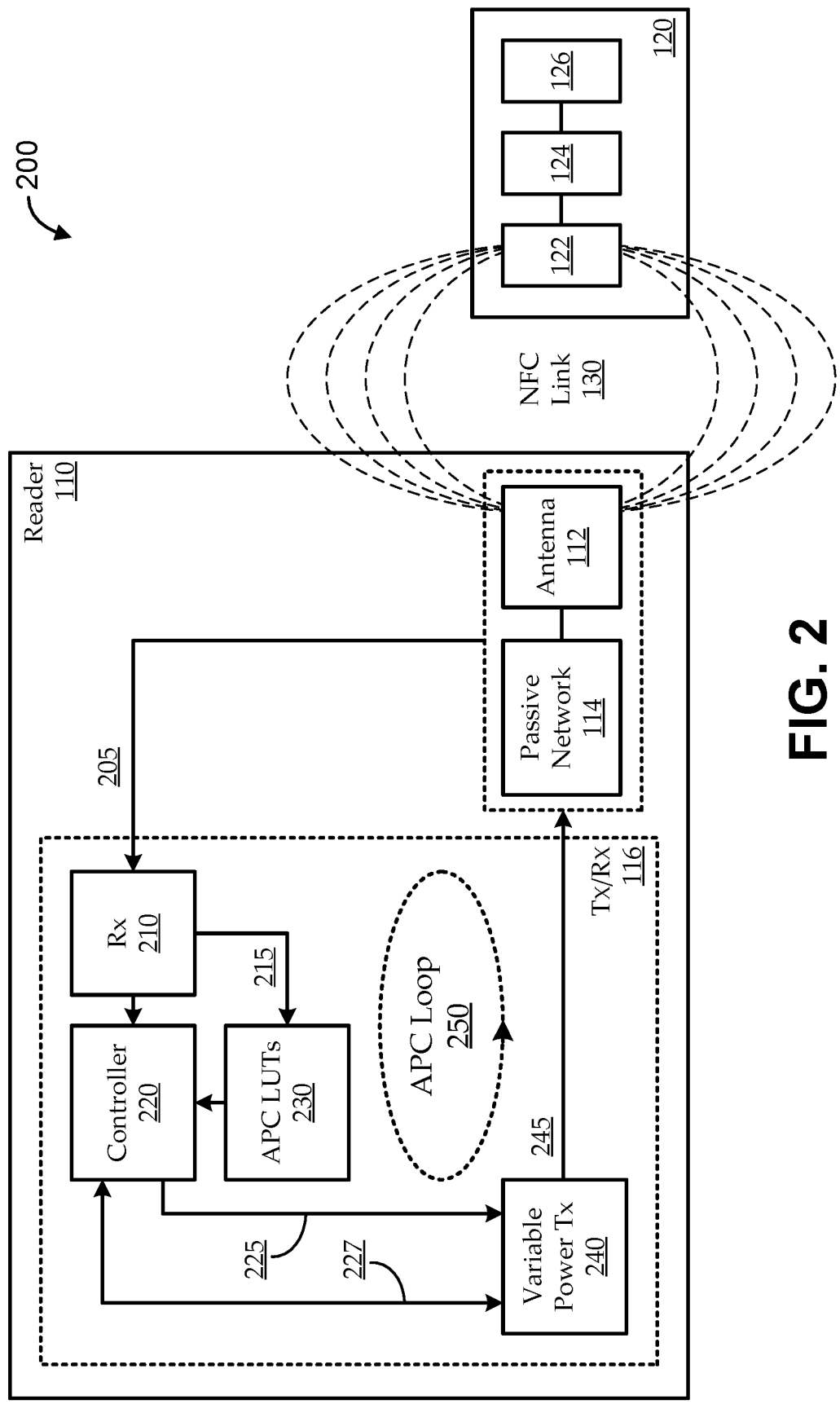
FIG. 2 shows an illustrative NFC communication environment with an example of a reader implementing conventional automatic power control (APC), according to some prior art embodiments.

FIG. 2 shows an illustrative NFC communication environment 200 with an example of a reader 110 implementing conventional APC, according to some prior art embodiments. As described with reference to FIG. 1, a reader 110 and a tag 120 are in communication via an NFC link 130. For example, the reader 110 and the tag 120 are in close enough proximity to be inductively coupled. The tag 120 includes a tag antenna 122, a tag passive network 124, and a tag transceiver block 126. The reader 110 has a reader antenna 112, a reader passive network 114, and a reader transceiver block 116. The reader transceiver block 116 is configured to implement a conventional APC loop 250 that can sense detuning at the reader 110 and can automatically control power of a variable power transmitter 240, accordingly.

Signals, such as the response signal 134 are received by the reader 110 from the tag 120 via the NFC link 130. These signals are received by, and are fed to the receiver (Rx) 210 as processed response signals 205. The receiver 210 can use the processed response signals 205 to extract data sent from the tag 120 and to generate one or more detuning signals 215 to indicate detuning conditions caused by the tag 120 (e.g., based on the tag 120 construction and position relative to the reader 110). The receiver 210 can also send extracted data signals to a controller 220. The detuning signals 215 are fed into a set of stored APC look-up tables (LUTs) 230, which can map detuning conditions indicated by the detuning signals 215 to corresponding pre-calibrated power settings for the values to where the new power settings of the variable power transmitter 240. The power setting data from the APC LUTs 230 is also fed to the controller 220. For example, the controller 220 can be implemented with a central processing unit CPU, an application-specific integrated circuit (ASIC), an application-specific instruction-set processor (ASIP), a digital signal processor (DSP), a field-programmable gate array (FPGA), a programmable logic device (PLD), a controller, a microcontroller unit, a reduced instruction set (RISC) processor, a complex instruction set processor (CISC), a microprocessor, or the like, or any combination thereof.

The controller can use the data received from the receiver 210 and from the APC LUTs 230 to generate signals for the variable power transmitter 240. For example the controller 220 generates power control signals 225 to control the power level of the variable power transmitter 240, and data signals 227 (e.g., including baseband data and other data for transmission to the tag 120 over the NFC link 130. The variable power transmitter 240 generate command signals 245 (e.g., including command signal 132) based on the received data signals 227 and the power control signals 225. The command signals 245 can be passed to the reader passive network 114 and the reader antenna 112 for transmission over the NFC link 130 at the adjusted power level.

While such a conventional approach can be somewhat effective, there are certain limitations. One such limitation is that, in such an implementation, the new power settings are not directly applied to the variable power transmitter 240. For example, relatively fast and/or large updates to transmitter power may be perceived as amplitude modulation (AM) on the reader 110 side and/or on the tag 120 side, which can interfere with actual AM data frames interchanged between the two sides and can eventually interrupt communications between the tag 120 and the reader 110.

Figure 3:
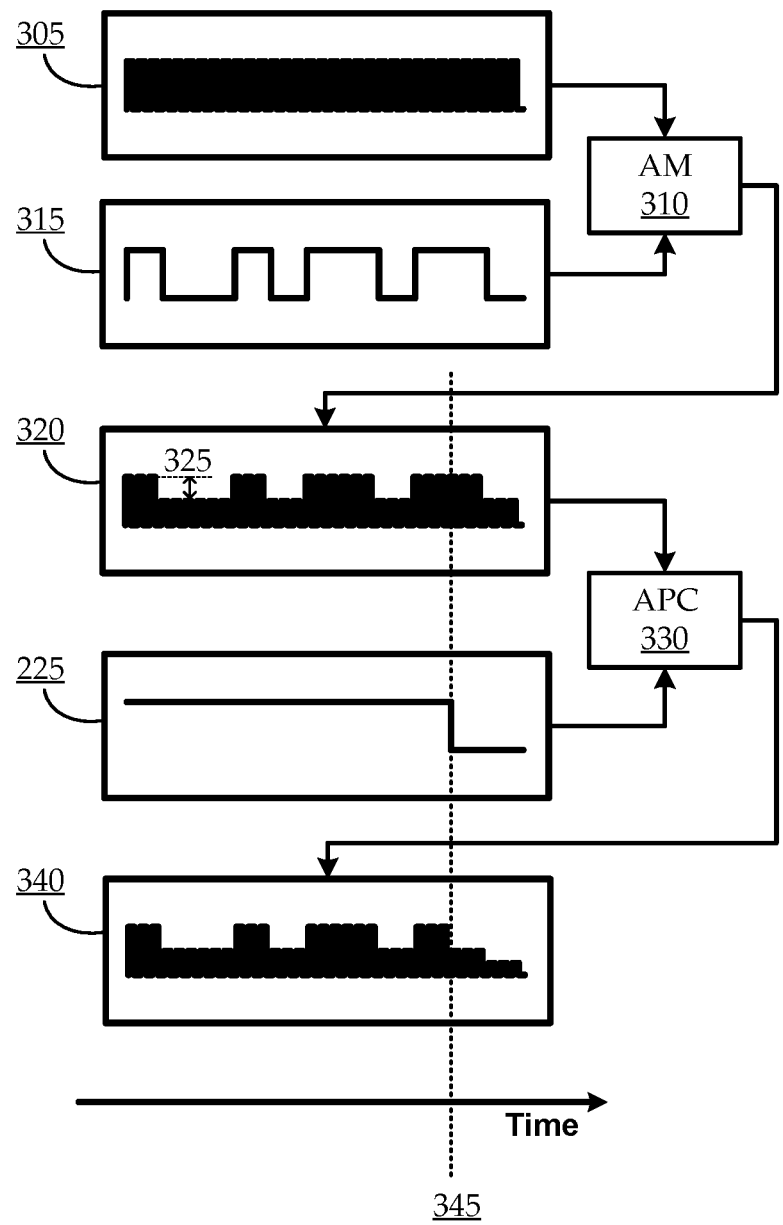
FIG. 3 shows illustrative plots of potential corruptions to an amplitude-modulated (AM) data frame arising from a conventional APC approach.

An example of such limitations can be seen by turning briefly to FIG. 3. FIG. 3 shows illustrative plots of potential corruptions to an AM data frame arising from a conventional APC approach. For example, an illustrative unmodulated RF carrier signal 305 and an illustrative modulation signal 315 (e.g., representing a bit stream) are fed to an amplitude modulation block 310. The amplitude modulation block 310 modulates the unmodulated RF carrier signal 305 according to the modulation signal 315 to generate a modulated carrier signal 320. It can be seen that the modulated carrier signal 320 has a modulation depth 325. At some time 345, APC occurs responsive to a detected change in field strength. This can be seen by the reduction in power level represented by power control signal 225. For example, as the tag 120 approaches the reader 110, it is desirable to reduce the transmission power at the reader 110 to avoid transmitting too much power to the tag 120 and potentially damaging tag 120 circuitry. An illustrative conventional APC block 330 is shown as adjusting the transmit power of the modulated carrier signal 320 according to the power control signal 225 to generate a power-adjusted modulated carrier signal 340. It can be seen that the power adjustment effectively lowered the HIGH level of the power-adjusted modulated carrier signal 340 to a level close to its previous LOW level, such that a HIGH data bit after the power adjustment may appear substantially as a LOW data bit after the power adjustment.

Many conventional implementations recognize and address this concern. For example, returning to FIG. 2, updated transmitter power settings calculated by the APC LUTs 230 are not fed directly to the variable power transmitter 240. Rather, those power settings are fed to the controller 220, which can use information from the transmit and receive data signals (e.g., transmit and receive windows) to assess the status and timing of the communication between the reader 110 and the tag 120. From such status and timing information, the controller 220 can determine suitable times at which it can update the transmitter power settings without interrupting the NFC communications. Typically, the controller 220 waits for specific time slots between communication frames to apply any new power settings, such that those power settings take effect only when neither the reader 110 nor the tag 120 is listening to the other.

While this approach can be effective in some applications, it still has a number of limitations. For example, such time division coordination can be effective when there are short communication frames and slow-moving tags 120. However, some communication frames have relatively long durations when compared to the speed of the motion of the tag 120 inside the operating volume, and the rate of variation of detuning conditions may be too slow to achieve field strength specifications. For example, if the tag 120 appreciably changes position during a communication frame duration, but the transmission power settings remain fixed throughout the frame duration, field strength specification are likely to be violated and/or damage may occur to the tag 120. As such, many conventional implementations include safeguards. One such safeguard is to force a mid-frame APC update, for example, if too much time has elapsed since a last update, or the detuning signals 215 indicate too large of a detected change in field strength. Another such safeguard is to impose a current limit on the variable power transmitter 240, so that the variable power transmitter 240 automatically ceases transmission if the power level gets too high. In either case, with relatively lengthy communication frames, there may be a high probability of having a forced APC update and/or a forced current gating. Either condition can potentially interrupt communications between the tag 120 and the reader 110, resulting in less reliable NFC communications.

Embodiments described herein include a number of novel approaches to APC. For example, conventional approaches tend to use time-division coordination, which seeks to coordinate timing of APC updates with communication frame timing. Embodiments described herein can use frequency-division coordination in the APC loop, which can permit APC updates concurrent with communication frames. For example, embodiments can run the APC loop continuously to update transmitter power in substantially continuous manner, but at a very low update frequency. The update frequency can be chosen to be appreciably lower than the modulation frequency (e.g., bit rate) of AM signals being communicated between the reader 110 and the tag 120, thereby ensuring that the power updates are not perceived as data. Such frequency-division coordination can achieve field strength specifications while avoiding degradations in communication reliability that are common in conventional approaches.

Various embodiments of a transceiver system are described herein for near-field communications. The transceiver system includes at least a receiver, a transmitter, and a frequency-division APC coordinator. The receiver can generally receive response signals via a near-field communication link. The transmitter can generally transmit command signals via the near-field communication link in accordance with a power control signal. The command signals and/or the response signals are generated by modulating a carrier within a modulation frequency band. Embodiments of the frequency-division APC coordinator receive a detuning signal from the receiver and/or from the variable power transmitter, generate an error signal by comparing the detuning signal with a reference detuning level, and update the power control signal according to an update frequency (e.g., corresponding to a APC loop bandwidth) that is a function of at least a filter frequency profile and is out-of-band with respect to a modulation frequency band. FIGS. 4-10 described various implementations of near-field reader systems that include components for implementing frequency-division APC coordinator features.

Figure 4:
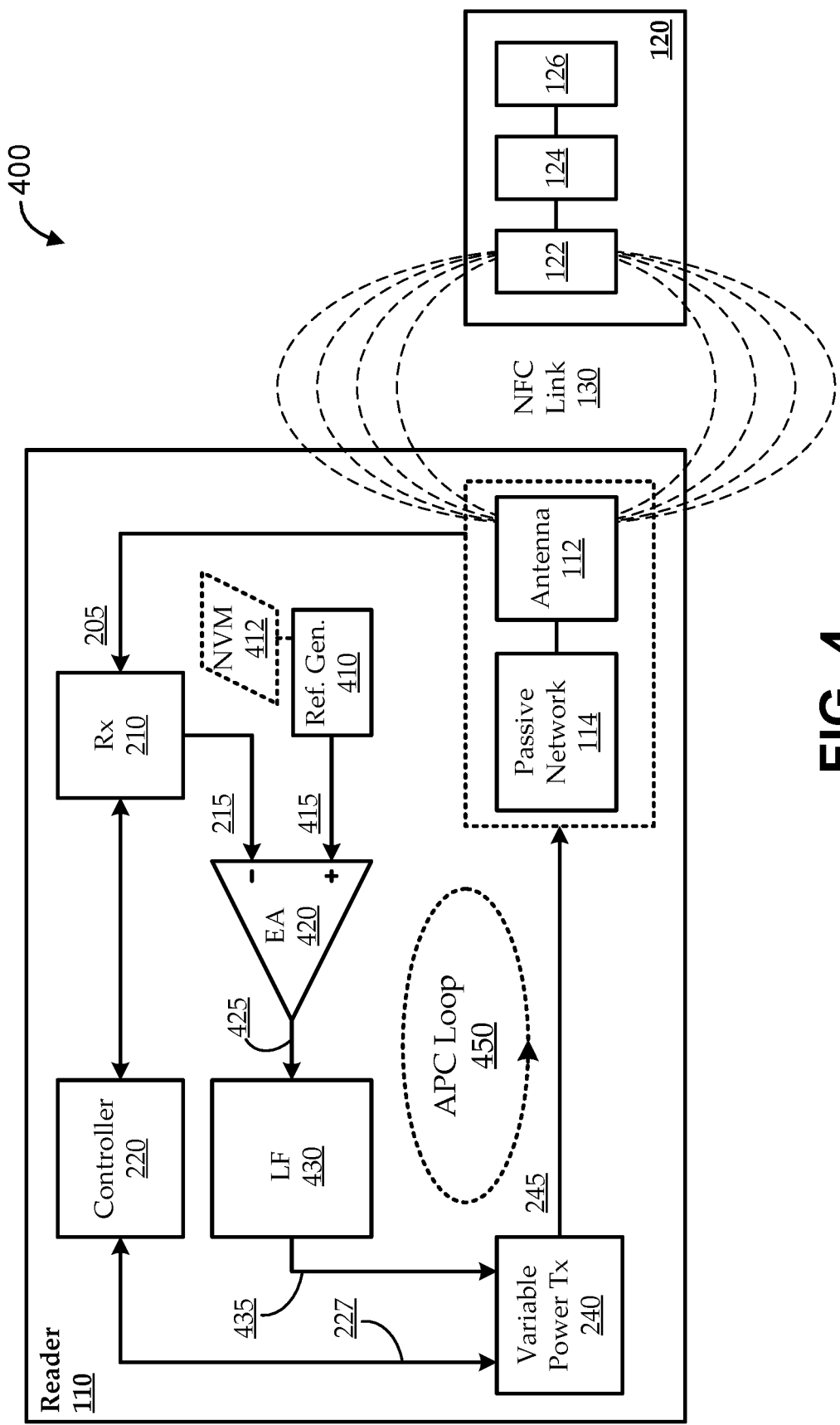
FIG. 4 shows an illustrative NFC communication environment 400 with a reader implementing frequency-division-coordinated APC, according to various embodiments described herein.

FIG. 4 shows an illustrative NFC communication environment 400 with a reader 110 implementing frequency-division-coordinated APC, according to various embodiments described herein. As described with reference to FIG. 1, a reader 110 and a tag 120 are in communication via an NFC link 130. For example, the reader 110 and the tag 120 are in close enough proximity to be inductively coupled. The tag 120 includes a tag antenna 122, a tag passive network 124, and a tag transceiver block 126. The reader 110 has a reader antenna 112, a reader passive network 114, and a number of other components that make up a reader transceiver block (not explicitly labeled). The reader transceiver block can include at least a receiver 210, a controller 220, a reference generator 410, an error amplifier 420, a loop filter 430, and a variable power transmitter 240. The reference generator 410, error amplifier 420, and loop filter 430 can be considered as implementing a frequency-division APC coordinator. Signals, such as the response signal 134 are received by the reader 110 from the tag 120 via the NFC link 130. These signals are received by, and are fed to the receiver 210 as processed response signals 205. The receiver 210 can use the processed response signals 205 to extract data sent from the tag 120 and to generate one or more detuning signals 215 to indicate detuning conditions caused by the tag 120 (e.g., based on the tag 120 construction and position relative to the reader 110). As described with reference to FIG. 2, the receiver 210 can also send extracted data signals to the controller 220, and the controller 220 can generate data signals 227 (e.g., including baseband data and other data) for transmission to the tag 120 over the NFC link 130.

At least some of the reader transceiver block components are configured to implement a frequency-division-coordinated APC loop 450 that can sense detuning at the reader 110 and can automatically control power to the variable power transmitter 240, accordingly. For example, the illustrated APC loop 450 does not include the controller 220. Embodiments of the reference generator 410 generate a reference signal 415. In some implementations, the reference generator 410 is programmed to produce the reference signal 415 to be suitable for the reader 110 and a target standard (e.g., NFC standard). The reference signal 415 can be generated to be of a same type as (e.g., comparable by the error amplifier 420 to) the detuning signal 215. For example, the reference signal 415 (and the detuning signals 215) can be represented as one or more voltage levels, current levels, power levels, digital words, etc.

In some embodiments, the reference signal 415 is a reference detuning signal based on a calibrated value. During calibration of the reader 110, some such embodiments can determine and set the reference detuning signal to configure the power settings for the variable power transmitter 240 at a level that causes the reader to produce a particular field strength for particular conditions. The reference detuning signal level can be determined by a digital control word having a value that is fixed during normal operation and stored in a non-volatile memory (NVM) 412. The NVM 412 can be part of the reference generator 410, or accessible by the reference generator 410, and the NVM 412 can be implemented with any suitable non-volatile memory (e.g., a register). The value of the digital control word used during normal operation can be written to the NVM 412 during (i.e., by the end of) a calibration process for the reader 110. In this way, the the NVM 412 can be considered as "programmed," and the reader 110 can be considered as "calibrated."

In some embodiments, the reader calibration process is performed under particular loading conditions to comply with a specific communication standard, such as an NFC standard. The particular loading conditions may include one or more particular reference tags (or other suitable "listeners") and one or more particular reference volume, which may be specified by the standard. The reference tags can effectively act as variable detuning loads to enable examining reader performance metrics using suitable loading conditions for each test. Regarding the reader field strength, an NFC standard can also dictate a number of specific combinations for reader loading conditions to stimulate and examine the reader minimum field strength, maximum field strength, and/or other field strength values. These combinations of reader loading conditions can be considered as pass/fail criteria for the reader field strength. For example, to pass the calibration process, the field strength generated by the reader at each reader loading combination must be shown to comply with a corresponding field strength requirement at that combination, as specified by the standard being used for the calibration. Typically, NFC and other similar standards can provide an indicator of field strength, or a manner in which to measure it. For example, some standards utilize the reference tags to provide an "indicator" of the reader field strength at a specific position inside the reference volume. This indicator can simply be a measurable electrical signal in the reference tag that is somehow coupled to the strength of the received reader field. The indicator signal can take any suitable electrical form, such as a voltage, a current, a power, a digital word, etc. Different field strength levels can ultimately be interpreted through the levels of the indicator signal of the reference tag.

During the reader calibration process, the APC can be enabled, and an arbitrary detuning reference signal (e.g., the mid-scale of a digital control word) can be chosen to start calibration. Dictated reader loading conditions can be scanned one by one using the specified reference tags and reference volume. At each loading combination, the reader field is examined and compared to the designated target. Based on results of the combinations, the detuning reference signal 415 is updated. For example, if the field is higher than the targets, the detuning reference signal 415 is decreased, and vice versa. The cycle of the dictated loading combinations can be repeated for the new value of the detuning reference signal 415. The calibration process can continue (e.g., iterating with each updated detuning reference signal 415) until a value of the detuning reference signal 415 is found to satisfy all the loading combinations (e.g., or some threshold satisfaction, as may be defined by the standard). This satisfying value of the detuning reference signal 415 can be stored to the NVM 412. The updates of the detuning reference signal 415 from each cycle to the next can be calculated based on a calibration algorithm engineered to yield an effective and efficient calibration process. The calibration process described above is one example of a calibration process. Other embodiments can use other calibration processes.

Embodiments of the error amplifier 420 can generate an error signal 425 by comparing the detuning signals 215 from the receiver 210 against the reference signal 415 from the reference generator 410. In various embodiments, the error amplifier 420 can be implemented in different ways, such as using a transconductance amplifier, a transimpedance amplifier, a voltage-voltage amplifier, a current-current amplifier, and/or any other suitable error amplifier 420. For example, the error signal 425 indicates a deviation of the detuning signals 215 from the reference signal 415. As illustrated, the error signal 425 is passed through the loop filter 430 to generate a power control signal 435 for the variable power transmitter 240. The loop filter 430 can be implemented as any suitable type of filter to control bandwidth and stabilize the loop, as described herein. For example, the loop filter 430 can include a low-pass filter, such that the power control signal 435 can effectively be a loop-filtered version of the error signal 425. The power control signals 435 control the transmitter power of the variable power transmitter 240, which effectively adjusts the field strength of the NFC link 130. For example, the variable power transmitter 240 generates command signals 245 based on the received data signals 227 and the power control signals 435, and the command signals 245 can be passed to the reader passive network 114 and the reader antenna 112 for transmission over the NFC link 130 at the adjusted power level. Adjustments in transmitter power level (e.g., and, correspondingly, to field strength) tend to elicit corresponding changes in the received response signals from the tag 120, which may ultimately manifest as updates to the detuning signals 215 generated by the receiver 210. The APC loop 450 seeks to stabilize the detuning signals 215 to be substantially equal to the reference signal 415, thereby dynamically keeping field characteristics to within a desired range of values.

Figure 5:
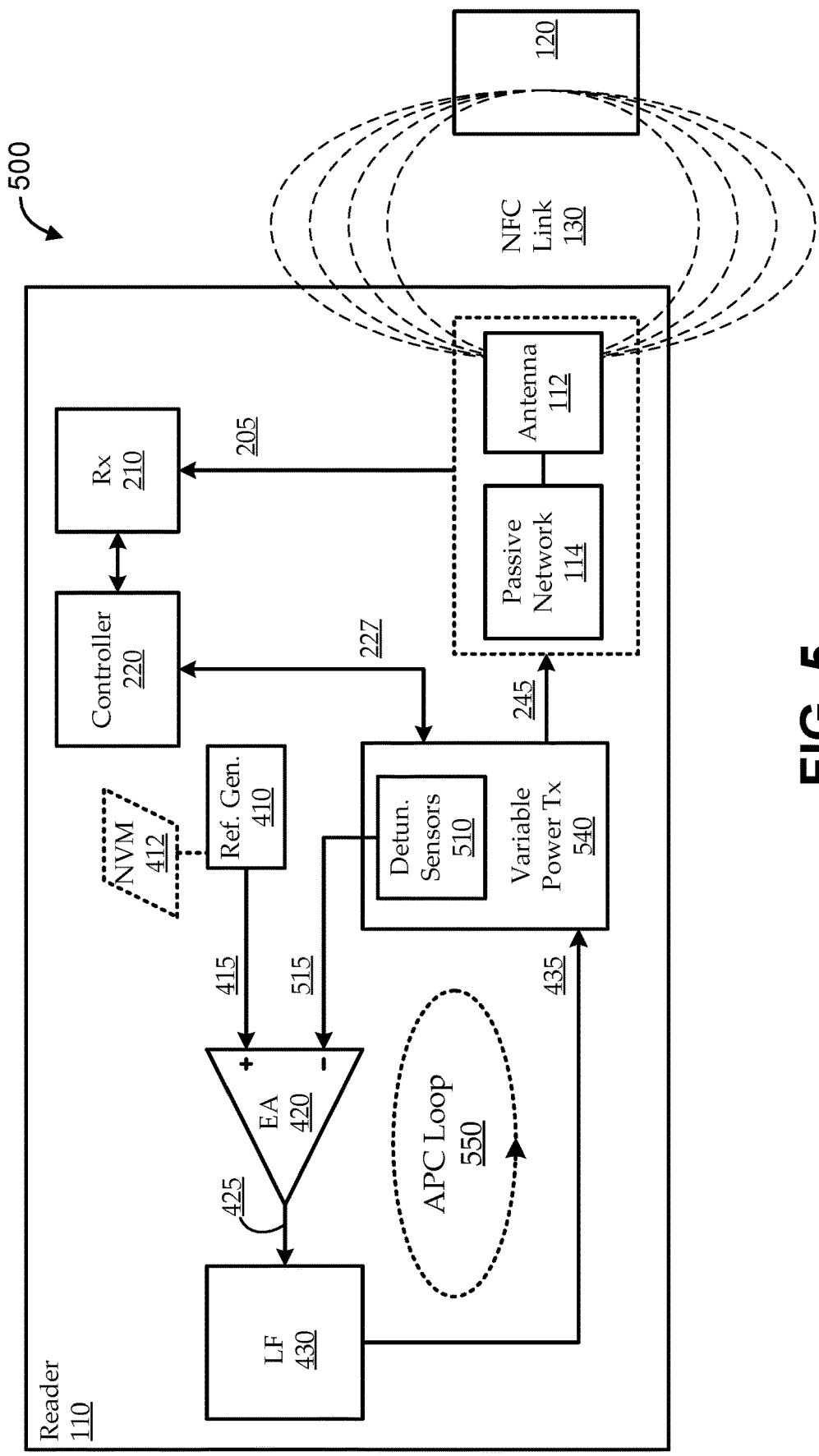
FIG. 5 shows another illustrative NFC communication environment with a reader implementing frequency-division-coordinated APC based on transmitter-side sensing, according to various embodiments described herein.

FIG. 5 shows another illustrative NFC communication environment 500 with a reader 110 implementing frequency-division-coordinated APC based on transmitter-side sensing, according to various embodiments described herein. The NFC communication environment 500 of FIG. 5 is similar to that of FIG. 4, and similar components are labeled with the same reference designators for added clarity. As illustrated, a reader 110 and a tag 120 are in communication via an NFC link 130. The reader 110 has a reader antenna 112, a reader passive network 114, and reader transceiver block components, including at least a receiver 210, a controller 220, a reference generator 410, an error amplifier 420, a loop filter 430, and a variable power transmitter 540. Unlike in FIG. 4, the variable power transmitter 540 of FIG. 5 also includes one or more transmitter-side detuning sensors 510. For example, the transmitter-side detuning sensors 510 can detect a present transmitter power level, voltage level, current level, etc. and can generate transmitter-side detuning signals 515, accordingly.

Similar to FIG. 4, embodiments of the error amplifier 420 generate an error signal 425 by comparing the transmitter-side detuning signals 515 from the variable power transmitter 540 (e.g., from the transmitter-side detuning sensors 510) against a reference signal 415 generated by the reference generator 410 (e.g., based on one or more calibrated values stored in a NVM 412 or other suitable memory). The error signal 425 can be passed through the loop filter 430 to generate a power control signal 435 for updating the transmitter power of the variable power transmitter 540. The variable power transmitter 540 can generate command signals 245 based on received data signals 227 from the controller 220 (from the receiver 210 path) and the power control signals 435 from the loop filter 430, and the command signals 245 can be passed to the reader passive network 114 and the reader antenna 112 for transmission over the NFC link 130 at the adjusted power level.

As described above (e.g., with reference to FIGS. 2 and 3), conventional approaches tend to pass the detuning signals 215 to the controller 220 so that the controller 220 can control the timing of APC updates (i.e., the controller 220 is part of the conventional APC loop). In the embodiments of FIGS. 4 and 5, the receiver-side detuning signals 215 or transmitter-side detuning signals 515 are used to generate the power control signals 435 without involvement of the controller 220. Thus, dynamic (e.g., continuous) changes in the detuning signals 215/515 can directly cause dynamic changes in the error signal 425 and the power control signals 435. However, embodiments of the loop filter 430 provide frequency-division coordination by effectively slowing down and smooth out changes in the power control signals 435 to produce a rate of change that is far slower than any signal changes that may be misinterpreted as data by the reader 110 or tag 120. Some embodiments of the loop filter 430 determine the APC loop 450 bandwidth and filter the error signal 425, accordingly, such that the corresponding power control signals 435 are updated at a frequency (fp) that is much slower than the modulation frequency (fm). For example, a corner frequency of a low-pass filter used as the loop filter 430 can be set to a frequency far below that of a data bit rate used by the reader 110 and the tag 120 for communications. References to the loop filter 430 "determining" the APC loop 450 bandwidth are intended to mean that the APC loop 450 bandwidth is a function of at least the filter frequency profile of the loop filter 430. In some embodiments described herein, the APC loop 450 bandwidth is further a function of other factors, such as detuning sensors, current sensors, etc.

Figure 6:
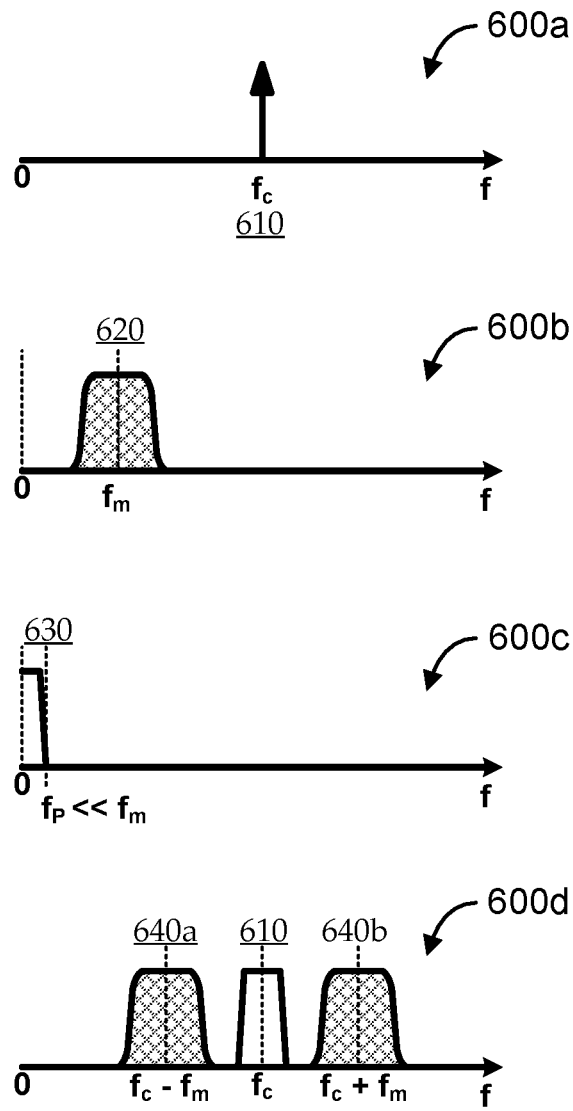
FIGS. 6 and 7 include a number of plots to illustrate the effects of such frequency-division coordination in context of APC for a near-field reader.
Figure 7:
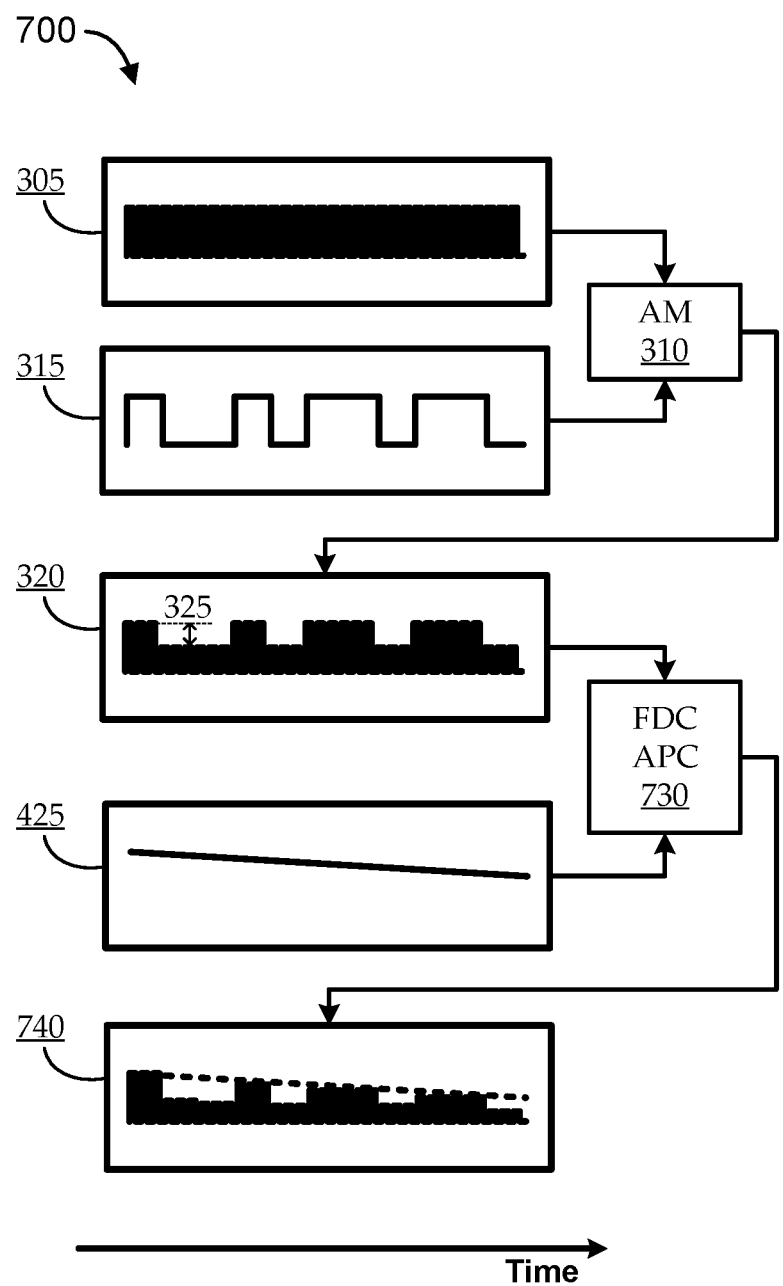

FIGS. 6 and 7 include a number of plots to illustrate the effects of such frequency-division coordination in context of APC for a near-field reader. Turning first to FIG. 6, a series of frequency domain plots 600 are shown. A first plot 600a shows an illustrative carrier frequency (fc) 610, and a second plot 600b shows a modulation bandwidth centered around a modulation frequency (fm) 620. A third plot 600c shows the frequency content of undesired DC and very low frequency signals either caused by the signal encoding scheme and random bits pattern or caused by the APC. The bandwidth of these undesired signals is represented by fp 630. A fourth plot 600d shows that modulation results in data bands corresponding to the modulation bandwidth around fc 610±fm 620. As long as fp 630 is far below fm 620, the filter provides a narrow frequency band around fc 610 that does not have any overlap with the data bands. For example, when the APC update frequency (corresponding to fp 630) is much slower than the data modulation frequency (corresponding to fm 620), the data frame is preserved. APC power updates can effectively be concentrated at frequencies close to DC, far below fm 620. Because receiver circuits of both the reader 110 and the tag 120 are typically designed for decoding in the desired data bands, the very low frequency (essentially DC) APC impacts would be filtered out (e.g., by baseband filter selectivity, etc.).

This can be further seen in FIG. 7. As in FIG. 3, an illustrative unmodulated RF carrier signal 305 and an illustrative modulation signal 315 (e.g., representing a bit stream) are shown as being fed to an amplitude modulation block 310. The amplitude modulation block 310 modulates the unmodulated RF carrier signal 305 according to the modulation signal 315 to generate a modulated carrier signal 320 with a modulation depth 325. Unlike in FIG. 3, an illustrative frequency-division-coordinated APC block (FDC APC) 730 is shown as adjusting the transmit power of the modulated carrier signal 320 according to a loop-filtered power control signal 425 to generate a power-adjusted modulated carrier signal 640. Unlike the sharp edge produced by the conventional APC block 330 discussed in FIG. 3, the slowly changing power control signals 425 in FIG. 7 produce a correspondingly gradual change in the HIGH and LOW modulation levels of the power-adjusted modulated carrier signal 740. The gradual changes do not appear as modulations (bit changes) and are unlikely to be misinterpreted as data by the reader 110 or tag 120. As such, the reader 110 and/or the tag 120 can continue to communicate (e.g., can be listening) even while APC adjustments are occurring.

Figure 8:
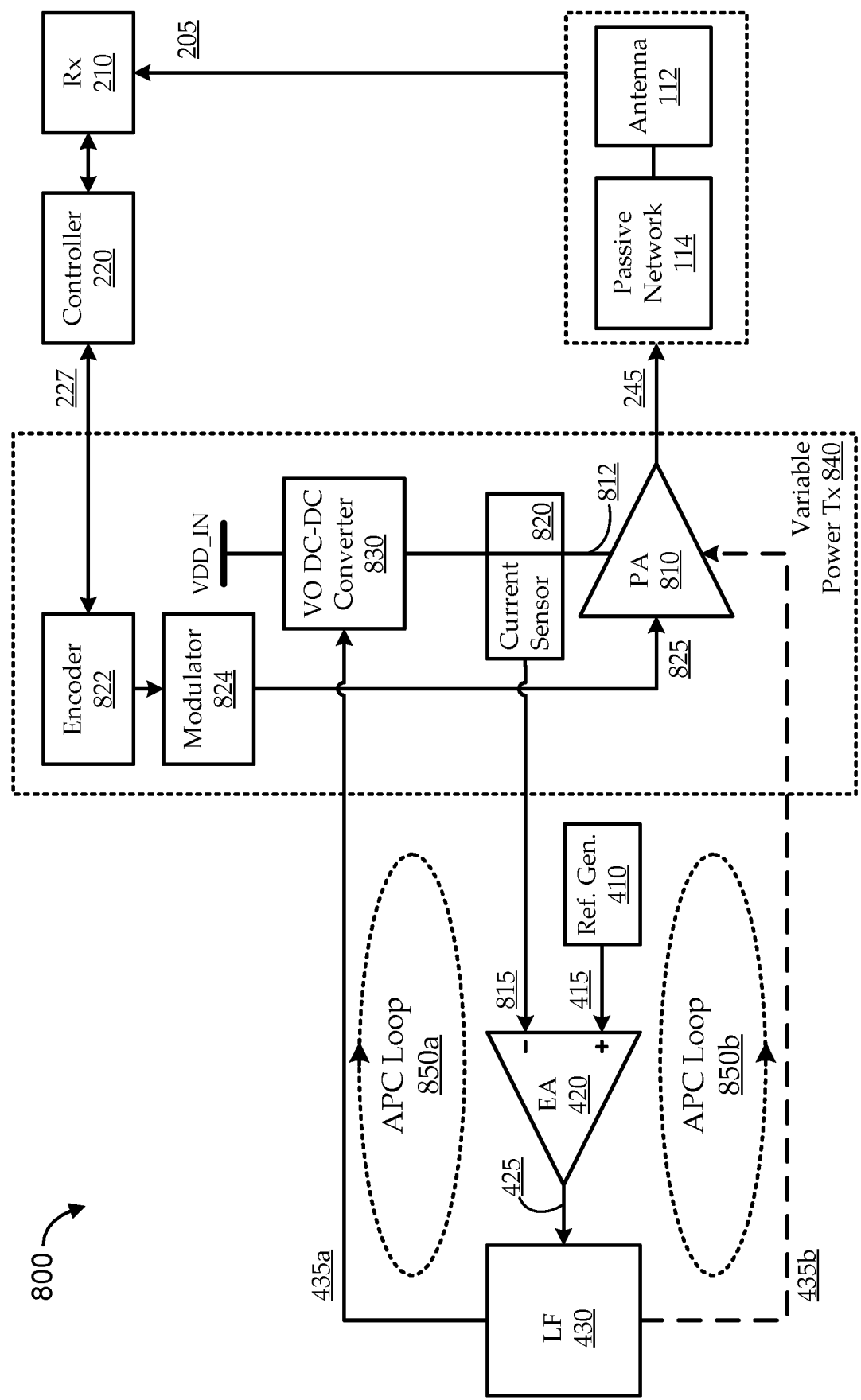
FIG. 8 shows an illustrative reader for implementing additional frequency-division-coordinated APC techniques based on transmitter-side sensing, according to various embodiments described herein.
Figure 9:
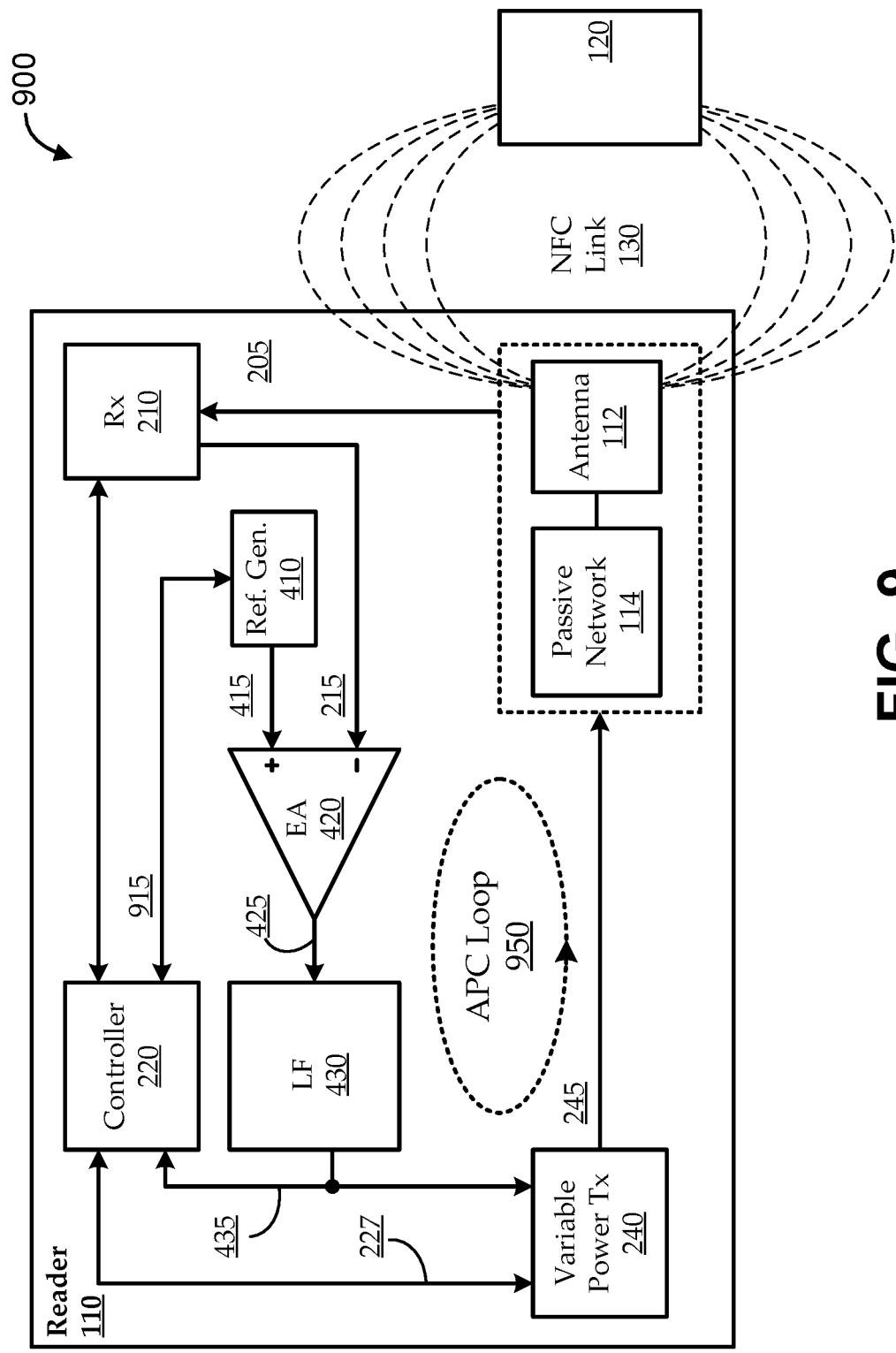
FIG. 9 shows an illustrative NFC communication environment with additional power control feedback, according to various embodiments described herein.
Figure 10:
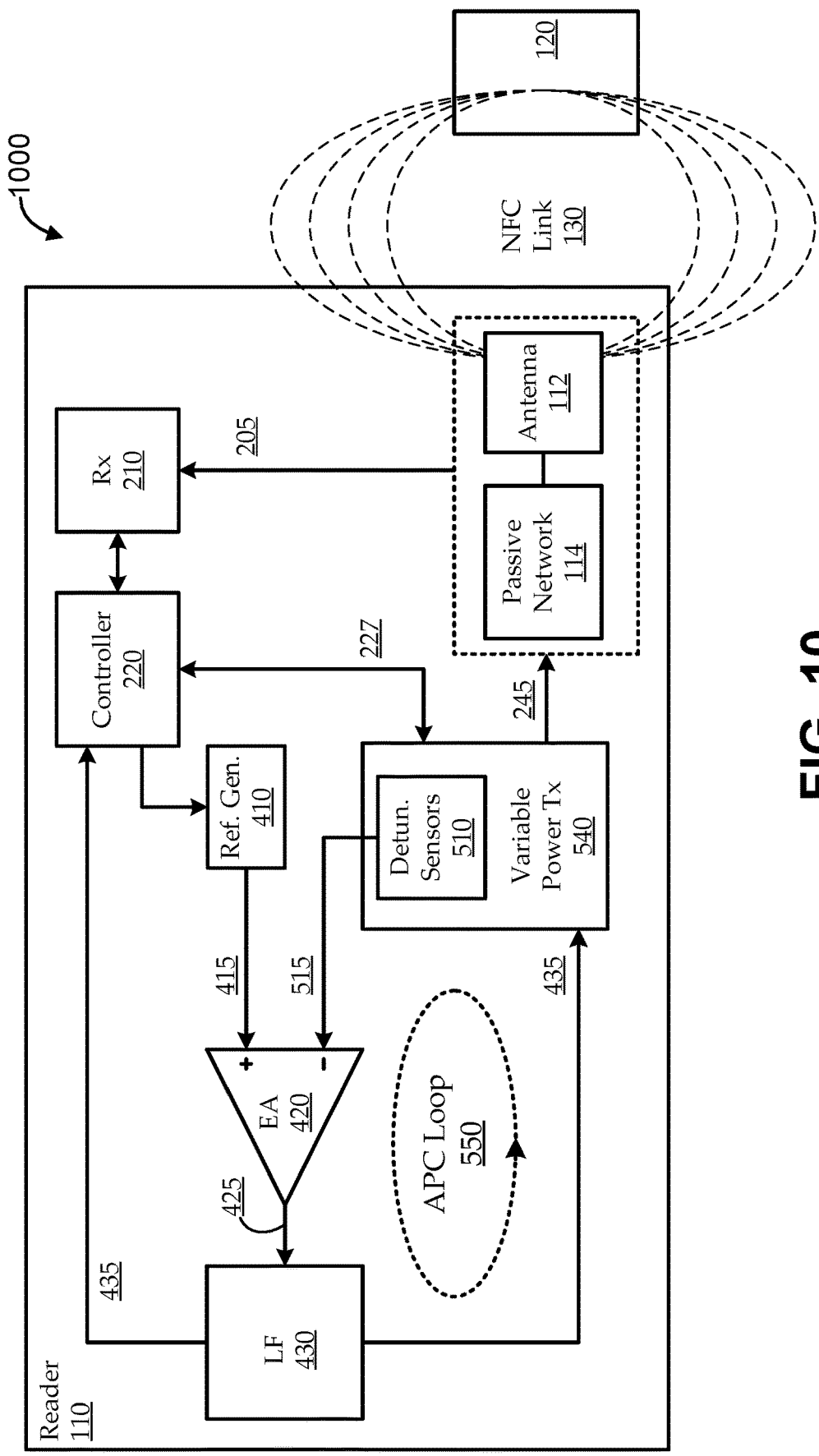
FIG. 10 shows an illustrative NFC communication environment, according to various embodiments described herein.

The embodiments described above with reference to FIGS. 4 and 5 only represent some approaches for implementing frequency-division-coordinated APC. FIGS. 8-10 provide additional approaches for implementing frequency-division-coordinated APC. FIG. 8 shows an illustrative reader 800 for implementing additional frequency-division-coordinated APC techniques based on transmitter-side sensing, according to various embodiments described herein. The reader 800 can be an implementation of the reader 110 of FIG. 5, or any suitable reader 110 of the environment 100 of FIG. 1. For example, the reader 800 can be used to effect NFC communications over an NFC link with a tag. As in the embodiments of FIGS. 4 and 5, the reader 110 has a reader antenna 112, a reader passive network 114, and reader transceiver block components, including at least a receiver 210, a controller 220, a reference generator 410, an error amplifier 420, a loop filter 430, and a variable power transmitter 840.

FIG. 8 shows a particular implementation of the variable power transmitter 840 configured to facilitate one or more frequency-division-coordinated APC loops 850. The variable power transmitter 840 can be an implementation of the variable power transmitter 540 of FIG. 5. As illustrated, the variable power transmitter 840 can include an encoder 822 coupled with the controller 220. For example, the controller 220 includes data circuits (e.g., coupled with memory, etc.) and clock circuits, such that the controller 220 can generate data to be transmitted to the tag 120 and a carrier signal at the carrier frequency. The encoder 822 can generate the bit-stream that forms the transmitted frame from the data output by the controller 220. The encoder 822 can feed a modulator 824 that generates a modulated carrier 825 from the encoded bit-stream and the carrier signal generated by the controller 220 (or other clock circuits). The modulated carrier 825 is fed into a power amplifier (PA) 810, which generates a command signal 245. The PA 810 can drive the passive network 114 with the command signal 245, which is thereby transmitted over the NFC link 230 via the reader antenna 112.

The PA 810 defines the transmit output power of the variable power transmitter 840, and the APC loop 850 (or APC loops 850) can be used effectively to control the transmit output power based on transmitter-side detuning sensing. In some embodiments a primary APC loop 850a provides coarse control over the transmit output power of the variable power transmitter 840. In some such embodiments, a secondary APC loop 850b further provides fine control over the transmit output power of the variable power transmitter 840.

A supply voltage (e.g., direct current (DC) voltage supply) of the PA 810 can be generated using a DC-DC converter 830. The DC-DC converter 830 can convert an external DC supply voltage (VDD_IN) into a desired PA 810 supply voltage (VDD_PA) 812. The DC-DC converter 830 can be implemented in any suitable manner, such as using an inductive or capacitive switched-mode DC-DC converter, a linear DC-DC converter (e.g., a Low Dropout (LDO) regulator, or other linear regulator), etc. The output power of the PA 810 is highly dependent on VDD_PA 812. Thus, controlling VDD_PA 812 as generated by the DC-DC converter 830 can provide coarse control for the transmit output power of the variable power transmitter 840.

With proper adjustment of the reader antenna 112 and the external reader passive network 114, the current drawn by the PA 810 can be indicative of present detuning conditions. As illustrated, a current sensor 820 can be used to sense a present current being drawn by the PA 810, and to generate detuning signals 815, accordingly. In some embodiments, the current sensor 820 is placed in the VDD_PA 812. In other embodiments, the current sensor 820 is integrated in the DC-DC converter 830, or on the main line. For example, the loop bandwidth of the APC loop 850 can be limited at least in part by the DC-DC converter 830, and placing the current sensor 820 in the DC-DC converter, or on the main line, can tend to provide additional bandwidth reduction because of the limiting speed of the DC-DC converter 830. Such additional bandwidth reduction can allow a reduction in the size of the loop filter 430. The generated detuning signals 815 can represent the detuning condition in any suitable manner (e.g., as a voltage, current, power, digital word, etc.). As in other embodiments (e.g., FIG. 5), the detuning signals 815 are fed to the error amplifier 420, along with a reference signal 415 generated by a reference generator 410 (e.g., based on one or more calibrated values stored in a NVM 412, or other suitable memory, which is not explicitly shown). The error amplifier 420 can output error signals 425 to the loop filter 430, which generates power control signals 435, accordingly.

According to a primary APC loop 850a, the power control signals 435a are fed back to the DC-DC converter 830, which can cause the DC-DC converter 830 to adjust VDD_PA 812. In some embodiments, it is desirable to provide additional (e.g., fine) control over the output transmit power. According to a secondary APC loop 850b, the power control signals 435b can be fed back to a PA strength control of the PA 810 for fine power control. For example, PA strength can be controlled by having a programmable number of PA 810 units in parallel, sizing certain devices inside the PA 810, controlling a certain bias voltages inside the PA 810, and/or in any other suitable manner. Essentially, the primary APC loop 850a and the secondary APC loop 850b can each regulate PA 810 current in response to sensed detuning, thereby stabilizing the PA 810 current around a target reference current specified by the reference signal 415.

FIG. 9 shows an illustrative NFC communication environment 900 with additional power control feedback, according to various embodiments described herein. The NFC communication environment 900 can be an alternative implementation of the environment 400 of FIG. 4. As described with reference to FIG. 4, a reader 110 and a tag 120 are in communication via an NFC link 130. The reader 110 has a reader antenna 112, a reader passive network 114, and a reader transceiver block, which can include at least a receiver 210, a controller 220, a reference generator 410, an error amplifier 420, a loop filter 430, and a variable power transmitter 240. The receiver 210 can use processed response signals 205 to generate one or more detuning signals 215 to indicate detuning conditions (e.g., based on the tag 120 construction, changes in the tag's 120 position relative to the reader 110, etc.). Embodiments of the error amplifier 420 can generate an error signal 425 by comparing the detuning signals 215 from the receiver 210 against a reference signal 415 generated by the reference generator 410. The error signal 425 can be passed through the loop filter 430 to generate power control signals 435 for the variable power transmitter 240. The variable power transmitter 240 can generate command signals 245 based on received data signals 227 from the controller 220 and the power control signals 435, and the command signals 245 can be passed to the reader passive network 114 and the reader antenna 112 for transmission over the NFC link 130 at the adjusted power level.

Unlike the implementation of FIG. 4, the implementation of FIG. 9 includes additional feedback of the power control signals 435 to the controller 220. In such an implementation, the controller 220 is part of the APC loop 950, but the APC loop 950 still operates according to frequency-division-coordinated APC (not time-division-coordinated). In particular, in the implementation of FIG. 4, the reference signal 415 is a time-invariant signal. For example, the reference signal 415 is a calibrated signal that provides a consistent reference. According to FIG. 9, the controller 220 can generate a reference control signal 915 based on the fed back power control signals 435. The generated reference control signal 915 is passed to the reference generator 410, and the reference generator 410 is configured to adjust the reference signal 415 based on the reference control signal 915. As such, the reference signal 415 is a time-variant signal that can be dynamically updated by the controller 220 to further enhance communication robustness. Now the APC can remain operating during communication frames using a fixed reference signal relying on the frequency coordination concept and conserving long communication frames uninterrupted. Between communication frames, the system controller can be free to update the reference signal of the APC based on multiple (e.g., a large number) of inputs from the transmitter, the receiver, and the APC itself. This can increase the flexibility of implementations to accommodate unexpected non-idealities, newly arising standards, etc. For example, such a dynamic reference can be utilized to account for irregularities, non-monotonicity, and/or any unexpected behaviors in the profile of the field strength versus the detuning signal. Such practical issues can arise from non-idealities in the antenna 112, the passive network 114, circuit boards or other substrates, amplifiers, etc.

FIG. 10 shows an illustrative NFC communication environment 1000, according to various embodiments described herein. The NFC communication environment 1000 can be an alternative implementation of the environment 500 of FIG. 5 (or reader 800 of FIG. 8). As illustrated, a reader 110 and a tag 120 are in communication via an NFC link 130.

The reader 110 has a reader antenna 112, a reader passive network 114, and reader transceiver block components, including at least a receiver 210, a controller 220, a reference generator 410, an error amplifier 420, a loop filter 430, and a variable power transmitter 540. The variable power transmitter 540 includes one or more transmitter-side detuning sensors 510 configured to detect preset effects of detuning on the variable power transmitter 540 (e.g., by detecting a present current draw) and to generate transmitter-side detuning signals 515, accordingly.

Embodiments of the error amplifier 420 generate an error signal 425 by comparing the transmitter-side detuning signals 515 from the variable power transmitter 540 (e.g., from the transmitter-side detuning sensors 510) against a reference signal 415 generated by the reference generator 410. The error signal 425 can be passed through the loop filter 430 to generate a power control signal 435 for updating the transmitter power of the variable power transmitter 540. The variable power transmitter 540 can generate command signals 245 based on received data signals 227 from the controller 220 (from the receiver 210 path) and the power control signals 435 from the loop filter 430, and the command signals 245 can be passed to the reader passive network 114 and the reader antenna 112 for transmission over the NFC link 130 at the adjusted power level. Similar to FIG. 9, the implementation of FIG. 10 includes additional feedback of the power control signals 435 to the controller 220. The controller 220 can generate a reference control signal 915 based on the fed back power control signals 435. The generated reference control signal 915 is passed to the reference generator 410, and the reference generator 410 is configured to adjust the reference signal 415 based on the reference control signal 915. As such, as in FIG. 9, the reference signal 415 is a time-variant signal that can be dynamically updated by the controller 220 to further enhance communication robustness.

Figure 11:
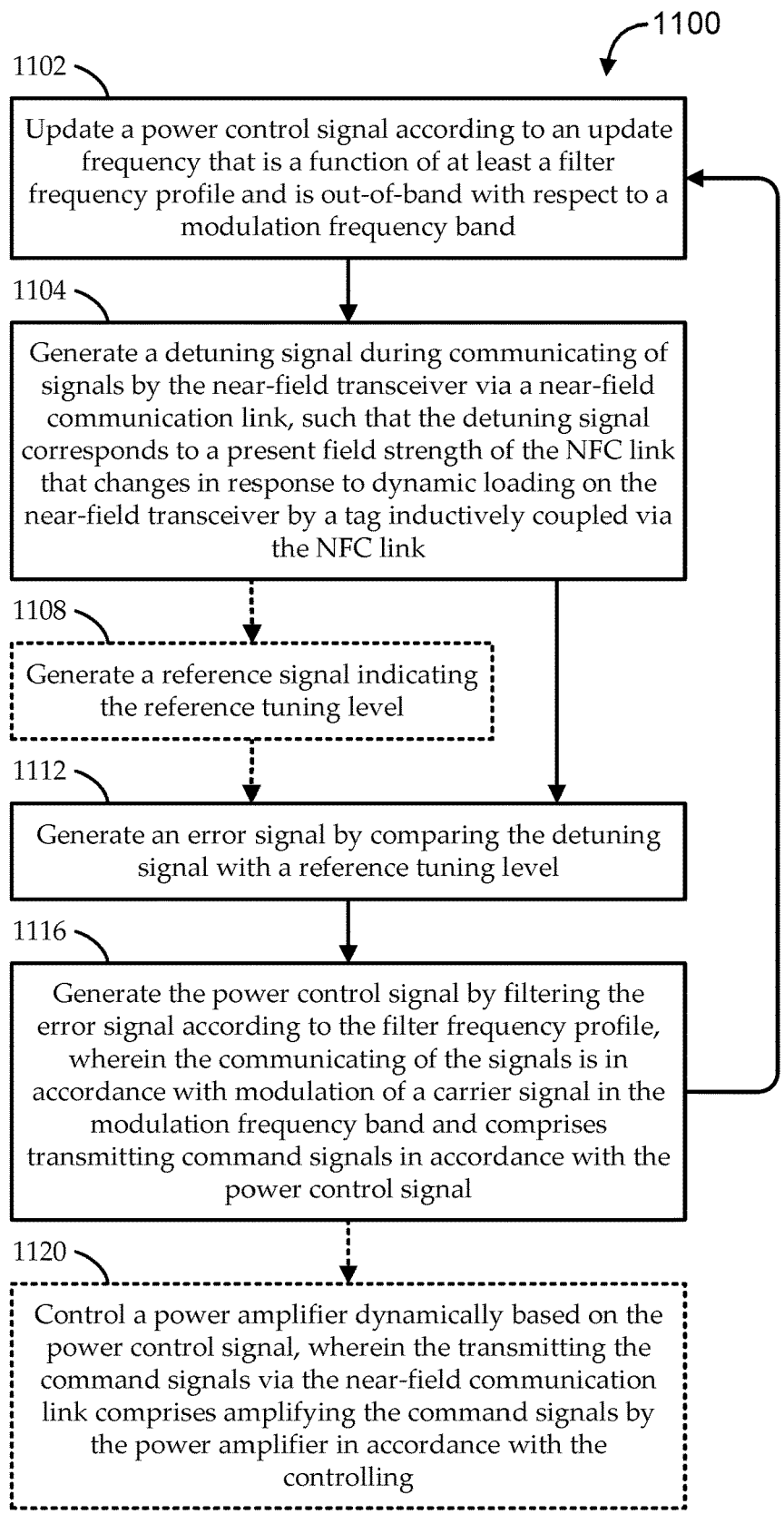
FIG. 11 shows a flow diagram of an illustrative method for frequency-division coordinated automatic power control of a near-field transceiver, according to various embodiments described herein.

FIG. 11 shows a flow diagram of an illustrative method 1100 for frequency-division coordinated automatic power control of a near-field transceiver, according to various embodiments described herein. Embodiments of the method 1100 begin at stage 1102 by updating a power control signal according to an update frequency that is a function of at least a filter frequency profile and is out-of-band with respect to a modulation frequency band. In some embodiment, the updating at stage 1102 is a dynamic process that can iterate through some or all of stages 1104-1116 if the method 1100.

Embodiments can proceed at stage 1104 by generating a detuning signal during communicating of signals by the near-field transceiver via a near-field communication link. The detuning signal can correspond to a present field strength of the near-field communication link that changes in response to dynamic loading on the near-field transceiver by a tag inductively coupled via the near-field communication link. In some embodiments, the generating of the detuning signal in stage 1104 is based on sensing an electrical characteristic of response signals received by the near-field transceiver via the near-field communication link, such that the sensed electrical characteristic is indicative of the present field strength of the near-field communication link.

At stage 1112, embodiments can generate an error signal by comparing the detuning signal with a reference detuning level. In some embodiments, at stage 1108, the method 1100 can include generating a reference signal indicating the reference detuning level, and the error signal can be generated at stage 1112 by comparing the detuning signal with the reference signal. In some embodiments, the reference signal generate at stage 1108 based at least on the power control signals, such that the reference signal is a time-varying reference signal indicating the reference detuning level as an adjustable reference detuning level responsive to the power control signals.

At stage 1116, embodiments can generate the power control signal by filtering the error signal according to the filter frequency profile. For example, the filter frequency profile can correspond to that of a low-pass filter, an integrating filter, a filter with multiple poles and/or zeros, and/or any suitable filter. The communicating of the signals by the near-field transceiver via the near-field communication link can be in accordance with modulation of a carrier signal in the modulation frequency band. For example, the modulation occurs in frequency ranges centered around frequencies defined by a carrier frequency plus a modulation frequency and the carrier frequency minus the modulation frequency, where the modulation frequency corresponds to a bit rate, or the like. For example, the filter frequency profile and/or other parameters of the APC loop can effectively set a loop bandwidth, which determines the update frequency for the power control signal. As described herein, the APC loop is designed so that the loop bandwidth causes the update frequency to be far out-of-band with respect to the modulation frequency band, such that changes in the power control signal are effectively ignored by the receiver and transmitter (e.g., treated as DC).

The communicating of the signals can include transmitting command signals by the near-field transceiver via the near-field communication link in accordance with the power control signal. In some embodiments, the communicating of the signals further comprises receiving response signals by the near-field transceiver via the near-field communication link during receive communication frames, and the transmitting the command signals is during transmit communication frames. The frequency-division-coordinated APC described by the method 1100 can permit updating of the power control signal to occur (e.g., continuously), even during receive communication frames and/or transmit communication frames.

As noted above, the generating of the detuning signal in stage 1104 can be based in some embodiments on sensing a present transmit power characteristic indicative of the present field strength of the near-field communication link. Some such embodiments further include, at stage 1120, controlling a power amplifier dynamically based on the power control signal, wherein command signals are transmitted via the near-field communication link by amplifying the command signals by the power amplifier in accordance with the controlling. In some such embodiments, the controlling is of an adjustable supply voltage of the power amplifier dynamically based on the power control signal, wherein command signals are transmitted via the near-field communication link by amplifying the command signals by the power amplifier in accordance with at least the supply voltage. For example, the generating the detuning signal at stage 1104 is based on sensing a present current level corresponding to the adjustable supply voltage, such that the controlling the adjustable supply voltage of the power amplifier is based on the power control signal is responsive to the present current level. In other such embodiments the controlling at stage 1120 is of a fine strength control of a power amplifier dynamically based on the power control signal, wherein command signals are transmitted via the near-field communication link by amplifying the command signals by the power amplifier in accordance with at least the fine strength control. As described above, the fine strength control is separate from the supply voltage of the power amplifier and separate from a gain of the power amplifier. Embodiments can control the adjustable supply voltage of the power amplifier as a coarse amplifier control along with controlling the fine strength control as a fine amplifier control.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A transceiver system for near-field communications, the transceiver system comprising:

a receiver to receive response signals via a near-field communication link;

a transmitter to transmit command signals via the near-field communication link in accordance with a power control signal, the command signals generated by modulating a carrier within a modulation frequency band; and a frequency-division coordinator coupled with the transmitter iteratively to:

receive a detuning signal from the receiver and/or from the transmitter;

generate an error signal by comparing the detuning signal with a reference detuning level; and generate the power control signal by filtering the error signal according to a filter frequency profile, such that the power control signal is updated dynamically according to an update frequency that is a function of at least the filter frequency profile and is out-of-band with respect to the modulation frequency band.

2. The transceiver system of claim 1, wherein:

the receiver is to receive the response signals during receive communication frames;

the transmitter is to transmit the command signals during transmit communication frames; and the frequency-division coordinator is to update the power control signal dynamically, such that the power control signal is time-varying during at least some of the receive communication frames and at least some of the transmit communication frames.

3. The transceiver system of claim 1, wherein the frequency-division coordinator comprises:

a reference generator to generate a reference signal indicating the reference detuning level;

an error amplifier to compare the detuning signal with the reference signal; and a loop filter to update the power control signal by filtering the error signal according to the filter frequency profile.

4. The transceiver system of claim 1, wherein:

the detuning signal is generated by the receiver based on sensing an electrical characteristic of the response signals; and the frequency-division coordinator is further coupled with the receiver to receive the detuning signals.

5. The transceiver system of claim 1, wherein:

the transmitter comprises one or more detuning sensors to sense a present transmit power characteristic of the transmitter and to generate the detuning signal based on the present transmit power characteristic; and the frequency-division coordinator is to receive the detuning signals from the transmitter.

6. The transceiver system of claim 5, wherein the transmitter comprises:

a power amplifier to amplify the command signals for transmission via the near-field communication link, the amplifying being in accordance with at least a supply voltage of the power amplifier;

a DC-DC converter configured to receive the power control signal from the frequency-division coordinator and to control the supply voltage of the power amplifier based on the power control signal.

7. The transceiver system of claim 6, wherein the transmitter further comprises:

a current sensor configured to:

sense a present current level corresponding to the supply voltage of the power amplifier as controlled by the DC-DC converter; and generate the detuning signal based on the present current level.

8. The transceiver system of claim 6, wherein:
a power amplifier comprises a fine strength control coupled with the frequency-division coordinator to be controlled based on the power control signals, the amplifying being further in accordance with the fine strength control.

9. The transceiver system of claim 1, further comprising:
a controller configured to generate data signals for transmission via the near-field communication link,
wherein the transmitter further comprises a modulator to at least partially generate the command signals by modulating the carrier within the modulation frequency band based on the data signals.

10. The transceiver system of claim 9, wherein:
the controller is coupled with the frequency-division coordinator to receive the power control signals;
the frequency-division coordinator comprises a reference generator coupled with the controller to generate a time-varying reference signal indicating the reference detuning level as an adjustable reference detuning level based on the power control signals.

11. The transceiver system of claim 1, wherein the reference detuning level is indicated by the frequency-division coordinator as a reference signal having a same signal type as the detuning signal, the same signal type being one or more of a power level, a voltage level, a current level, or a digital word.

12. A near-field reader system comprising:
a reader antenna and a reader passive network, coupled with the transceiver system of claim 1, the reader antenna and the reader passive network configured to:
establish the near-field link by inductive coupling with a tag when a proximity of the tag to the near-field reader system is within a threshold distance, the establishing causing variable loading of the near-field reader system by the tag based at least on the proximity;
receive the response signals via the near-field communication link and pass the response signals to the receiver; and
receive the command signals from the transmitter and transmit the command signals via the near-field communication link.

13. A method for frequency-division coordinated automatic power control of a near-field transceiver, the method comprising:
updating a power control signal, according to an update frequency that is a function of at least a filter frequency profile and is out-of-band with respect to a modulation frequency band, by iteratively:
generating a detuning signal during communicating of signals by the near-field transceiver via a near-field communication link, such that the detuning signal corresponds to a present field strength of the near-field communication link that changes in response to dynamic loading on the near-field transceiver by a tag inductively coupled via the near-field communication link;
generating an error signal by comparing the detuning signal with a reference detuning level; and
generating the power control signal by filtering the error signal according to the filter frequency profile,
wherein the communicating of the signals by the near-field transceiver via the near-field communication link is in accordance with modulation of a carrier signal in the modulation frequency band and comprises transmitting command signals by the near-field transceiver via the near-field communication link in accordance with the power control signal.

14. The method of claim 13, wherein:
the communicating of the signals further comprises receiving response signals by the near-field transceiver via the near-field communication link during receive communication frames;
the transmitting the command signals is during transmit communication frames; and
the updating the power control signal is during at least one of the receive communication frames or at least one of the transmit communication frames.

15. The method of claim 13, further comprising:
generating a reference signal indicating the reference detuning level,
wherein the generating the error signal is by comparing the detuning signal with the reference signal.

16. The method of claim 15, wherein:
generating the reference signal is based at least on the power control signals, such that the reference signal is a time-varying reference signal indicating the reference detuning level as an adjustable reference detuning level responsive to the power control signals.

17. The method of claim 13, wherein:
the communicating of the signals further comprises receiving response signals by the near-field transceiver via the near-field communication link;
the generating the detuning signal is based on sensing an electrical characteristic of the response signals indicative of the present field strength of the near-field communication link.

18. The method of claim 13, wherein:
the generating the detuning signal is based on sensing a present transmit power characteristic indicative of the present field strength of the near-field communication link.

19. The method of claim 18, further comprising:
controlling an adjustable supply voltage of a power amplifier dynamically based on the power control signal,
wherein the transmitting the command signals via the near-field communication link comprises amplifying the command signals by the power amplifier in accordance with at least the supply voltage.

20. The method of claim 19, wherein:
the generating the detuning signal is based on sensing a present current level corresponding to the adjustable supply voltage, such that the controlling the adjustable supply voltage of the power amplifier based on the power control signal is responsive to the present current level.

21. The method of claim 18, further comprising:
controlling a fine strength control of a power amplifier dynamically based on the power control signal, the fine strength control separate from a supply voltage of the power amplifier and separate from a gain of the power amplifier,
wherein the transmitting the command signals via the near-field communication link comprises amplifying the command signals by the power amplifier in accordance with at least the fine strength control.

* * * * *